United States Patent
Long et al.

(10) Patent No.: US 9,966,389 B2
(45) Date of Patent: May 8, 2018

(54) ARRAY SUBSTRATE AND MANUFACTURING METHOD THEREOF AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Yue Long, Beijing (CN); Fan Li, Beijing (CN); Yang Wang, Beijing (CN)

(73) Assignees: BOE Technology Group Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days. days.

(21) Appl. No.: 14/654,141

(22) PCT Filed: Sep. 26, 2014

(86) PCT No.: PCT/CN2014/087521
§ 371 (c)(1),
(2) Date: Jun. 19, 2015

(87) PCT Pub. No.: WO2015/192526
PCT Pub. Date: Dec. 23, 2015

(65) Prior Publication Data
US 2016/0260737 A1    Sep. 8, 2016

(30) Foreign Application Priority Data
Jun. 18, 2014    (CN) .......................... 2014 1 0273612

(51) Int. Cl.
*H01L 29/10*        (2006.01)
*H01L 21/00*        (2006.01)
(Continued)

(52) U.S. Cl.
CPC .......... *H01L 27/124* (2013.01); *G02F 1/1333* (2013.01); *H01L 27/127* (2013.01);
(Continued)

(58) Field of Classification Search
CPC ................................................ H01L 21/76877
(Continued)

(56) References Cited

U.S. PATENT DOCUMENTS 9,159,721 B2*    10/2015    Okawara ............. H01L 27/0635
2002/0105604 A1*    8/2002    Ha ..................... G02F 1/133555
349/43
(Continued)

FOREIGN PATENT DOCUMENTS

CN        1455291 A        11/2003
CN        101055887 A      10/2007
(Continued)

OTHER PUBLICATIONS

First Office Action dated Jun. 2, 2016 corresponding to Chinese application No. 201410273612.8.
(Continued)

*Primary Examiner* — Igwe U Anya
(74) *Attorney, Agent, or Firm* — Nath, Goldberg & Meyer; Joshua B. Goldberg; Annie Kock

(57) ABSTRACT

This invention provides an array substrate, a manufacturing method thereof and a display device, the array substrate comprises a common electrode line, a thin film transistor and a common electrode, the common electrode line is provided below an active layer of the thin film transistor, and is provided with a main via thereabove, the common electrode is electrically connected to the common electrode line through a main connection portion in the main via, the main connection portion comprises an upper main connection portion and a lower main connection portion, the lower main
(Continued)

connection portion comprises a main body and a flange provided on the main body and extending towards a direction away from a center of the main via, a lower end of the upper main connection portion is connected to the flange, an upper end of the upper main connection portion is connected to the common electrode.

6 Claims, 3 Drawing Sheets

(51) Int. Cl.
    *H01L 27/12*     (2006.01)
    *G02F 1/1333*     (2006.01)
    *H01L 29/786*     (2006.01)

(52) U.S. Cl.
    CPC ...... *H01L 27/1244* (2013.01); *H01L 29/7869* (2013.01); *H01L 27/1225* (2013.01)

(58) Field of Classification Search
    USPC .......................................... 257/43; 438/151
    See application file for complete search history.

(56) References Cited

U.S. PATENT DOCUMENTS

| | | | | |
|---|---|---|---|---|
| 2003/0071956 A1* | 4/2003 | Sasaki | ................ | G02F 1/13394 349/155 |
| 2009/0108259 A1* | 4/2009 | Lin | ................ | G02F 1/134363 257/59 |
| 2013/0147779 A1* | 6/2013 | Ochiai | ................ | G09G 5/003 345/211 |
| 2014/0138714 A1* | 5/2014 | Chen | ................ | H01L 21/77 257/88 |
| 2014/0159034 A1* | 6/2014 | Yang | ................ | H01L 27/1296 257/43 |
| 2014/0175467 A1* | 6/2014 | Choi | ................ | G02F 1/134363 257/89 |
| 2014/0340607 A1* | 11/2014 | Nakata | ................ | H01L 29/7869 349/46 |
| 2014/0354933 A1* | 12/2014 | Tsai | ................ | H01L 27/1225 349/138 |

FOREIGN PATENT DOCUMENTS

| | | |
|---|---|---|
| CN | 101957529 A | 1/2011 |
| CN | 102023429 A | 4/2011 |
| CN | 102832170 A * | 12/2012 |
| CN | 203983281 U | 12/2014 |
| JP | H0425155 A | 1/1992 |
| JP | H05326745 A | 12/1993 |

OTHER PUBLICATIONS

International Patent Application No. PCT/CN2014/087521, International Search Report dated Mar. 27, 2015, fourteen (14) pages.
International Patent Application No. PCT/CN2014/087521, English Translation of Written Opinion of the International Searching Authority dated Mar. 27, 2015, eight (8) pages.

* cited by examiner

ARRAY SUBSTRATE AND MANUFACTURING METHOD THEREOF AND DISPLAY DEVICE

This is a National Phase Application filed under 35 U.S.C. 371 as a national stage of PCT/CN2014/087521, filed Sep. 26, 2014, an application claiming the benefit of Chinese Application No. 201410273612.8, filed Jun. 18, 2014, the content of each of which is hereby incorporated by reference in its entirety.

FIELD OF THE INVENTION

The present invention relates to the field of display technology, and particularly to an array substrate, a manufacturing method of the array substrate, and a display device comprising the array substrate.

BACKGROUND OF THE INVENTION

FIG. 1 shows an array substrate, which comprises a common electrode 10, a common electrode line 20, a thin film transistor 30 and a pixel electrode 40, and the common electrode 10 is electrically connected to the common electrode line 20. An etch stop layer 31 and a passivation layer 50 are provided between a layer where the common electrode 10 is located and a layer where the common electrode line 20 is located. To electrically connect the common electrode 10 with the common electrode line 20, a via 60 can be formed above the common electrode line 20, while forming the common electrode 10 by depositing, a layer of common electrode material is also formed on side walls and a bottom side (i.e. an upper surface of the common electrode line 20) of the via 60, the common electrode material inside the via 60 is formed as a connection portion 70 for electrically connecting the common electrode line 20 with the common electrode 10. As the passivation layer 50 and the etch stop layer 31 have relatively large thicknesses, when the connection portion 70 is formed, a breach is likely to be formed on the side wall of the via 60, resulting in poor connection between the common electrode line 20 and the common electrode 10.

Therefore, how to prevent the poor connection between the common electrode line 20 and the common electrode 10 has become a technical problem to be solved urgently in the art.

SUMMARY OF THE INVENTION

An object of the present invention is to provide an array substrate, a manufacturing method of the array substrate, and a display device comprising the array substrate. In the array substrate, a reliable electrical connection is realized between the common electrode and the common electrode line.

To realize the above object, as one aspect of the present invention, provided is an array substrate, which comprises a common electrode line, a thin film transistor and a common electrode, wherein the common electrode line is provided to be spaced apart from an active layer of the thin film transistor, and the common electrode line is provided with a main via thereabove, and wherein the common electrode is connected to the common electrode line through a main connection portion which is at least partially provided in the main via, the main connection portion comprises an upper main connection portion and a lower main connection portion, the lower main connection portion comprises a main body, and a flange provided on the main body and extending towards a direction away from a center of the main via, a lower end of the upper main connection portion is connected to the flange, and an upper end of the upper main connection portion is connected to the common electrode.

Preferably, the main via comprises an upper main via and a lower main via, a width of the upper main via is larger than that of the lower main via, the main body is provided in the lower main via, the flange is provided at a position where the upper main via and the lower main via are connected, the upper main connection portion is provided in the upper main via, and the main connection portion is integrated with the common electrode.

Preferably, the main via comprises an upper main via and a lower main via, and the flange extends from an upper end of the lower main via to the exterior of the main via.

Preferably, the lower main connection portion is formed simultaneously with a pixel electrode of the array substrate, and the upper main connection portion is integrated with the common electrode.

Preferably, the flange is provided with a secondary via thereabove, and the common electrode is electrically connected to the flange through a secondary connection portion provided in the secondary via.

Preferably, the active layer of the thin film transistor is made of metal oxide, and the array substrate further comprises an etch stop layer provided above the active layer of the thin film transistor, and the flange is provided above the etch stop layer.

Preferably, a passivation layer is provided between the etch stop layer and the common electrode.

As another aspect of the present invention, provided is a manufacturing method of an array substrate, comprising steps of:

S10, forming a pattern including a common electrode line and a gate of a thin film transistor on a base;

S11, forming a gate insulation layer above the pattern including the common electrode line and the gate of the thin film transistor;

S12, forming an active layer of the thin film transistor on the gate insulation layer above the gate;

S13, forming an etch stop layer above the gate insulation layer and the active layer of the thin film transistor;

S15, forming a passivation layer above the etch stop layer, wherein the manufacturing method further comprises steps of:

S14, forming a main via, so that it is above the common electrode line and reaches the common electrode line;

S16, forming a pattern including a main connection portion, so that the main connection portion is at least partially provided in the main via, the main connection portion comprises an upper main connection portion and a lower main connection portion, the lower main connection portion comprises a main body and a flange provided on the main body and extending in a direction away from a center of the main via, a lower end of the upper main connection portion is connected to the flange, and the main body is connected to the common electrode line; and S17, forming a pattern of a common electrode, so that the common electrode is connected to an upper end of the upper main connection portion.

Preferably, the active layer of the thin film transistor is made of metal oxide, and wherein the step S14 comprises steps of:

S14-1, after the step S13, forming a lower main via penetrating through the etch stop layer and the gate insulation layer to reach the common electrode line; and S14-2, after the step S15, forming an upper main via at a position on the etch stop layer corresponding to the lower main via, and removing material for the passivation layer deposited in the lower main via, so that the upper main via is communicated with the lower main via to form a main via.

Preferably, a width of the upper main via is larger than that of the lower main via, the steps S16 and S17 are performed simultaneously, the upper main connection portion formed in the step S16 is located in the upper main via, the main body of the lower main connection portion is located in the lower main via, the flange is located at a position where the upper main via and the lower main via are connected, and the flange is provided on the etch stop layer.

Preferably, the width of the upper main via is larger than or equal to that of the lower main via, and the step S16 comprises steps of:

S16-1, forming the lower main connection portion so that the flange is on the etch stop layer;

S16-2, forming the upper main connection portion, wherein the step S16-1 is performed between the step S14-1 and the step S15, and in the step S16-1, a pixel electrode is formed above the etch stop layer, and the steps S16-2 and S17 are performed simultaneously.

Preferably, the manufacturing method further comprises steps of:

S18, forming a secondary via above the flange; and

S19, providing, in the secondary via, a secondary connection portion for electrically connecting the common electrode with the flange.

Preferably, the steps S19 and S17 are performed simultaneously.

As still another aspect of the present invention, provided is a display device comprising the above array substrate.

In the array substrate provided by the present invention, due to addition of the flange extending in the direction away from the center of the main via, vertical length of the upper main connection portion is smaller than total depth of the main via, and vertical length of the main body of the lower main connection portion is smaller than total depth of the main via, therefore, when the main connection portion is formed, breach is unlikely to be formed on the upper connection portion and the lower connection portion of the main connection portion, and the metal layer forming the main connection portion is continuous and uniform, thus possibility of disconnection occurring in the main connection portion is decreased. In other words, in the array substrate provided by the present invention, reliable electrical connection between the common electrode line and the common electrode is realized. Hence, a display device comprising the array substrate may display images better.

In addition, when the array substrate provided by the present invention is manufactured by using the manufacturing method of the present invention, complexity of the manufacturing method is not increased. That is to say, when the array substrate provided by the present invention is manufactured by using the manufacturing method of the present invention, the productivity is high.

BRIEF DESCRIPTION OF THE DRAWINGS

Accompanying drawings are used to provide further understanding of the present invention, constitute a part of the specification, and are used to explain the present invention together with the following embodiments, but not to limit the present invention, wherein.

Figure 1:
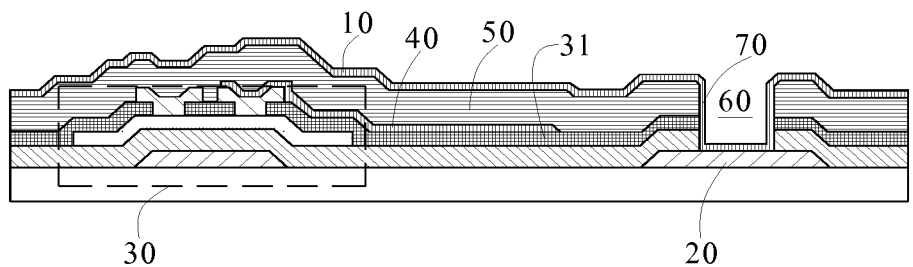
FIG. 1 is a diagram of an existing array substrate.

| Description of reference numerals: | | | |
|---|---|---|---|
| 10: | common electrode | 20: | common electrode line |
| 30: | thin film transistor | 31: | etch stop layer |
| 32: | active layer | 33: | source |
| 34: | drain | 35: | gate |
| 36: | gate insulation layer | 40: | pixel electrode |
| 50: | passivation layer | 60: | via |
| 61: | main via | 62: | secondary via |
| 70: | connection portion | 71: | upper main connection portion |
| 72: | lower main connection portion | 80: | secondary connection portion |
| 91: | first mask plate | 92: | second mask plate |
| 61a: | upper main via | 61b: | lower main via |
| 72a: | main body | 72b: | flange |

DETAILED DESCRIPTION OF THE EMBODIMENTS

Embodiments will be described in detail below in conjunction with the accompanying drawings. It should be understood that, the embodiments described herein are only used to describe and explain the present invention, but not to limit the present invention.

It should be understood that, the orientation words "upper" and "lower" used in the specification refer to upwards direction and downwards direction in accompanying drawings, respectively.

Figure 2:
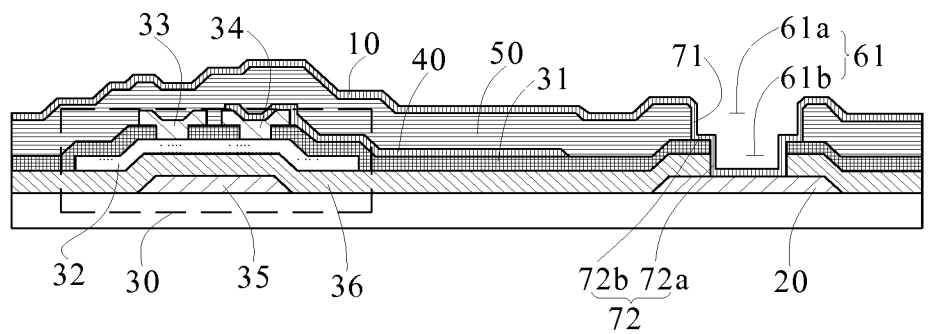
FIG. 2 is a diagram illustrating an array substrate of a first embodiment in the present invention.
Figure 3:
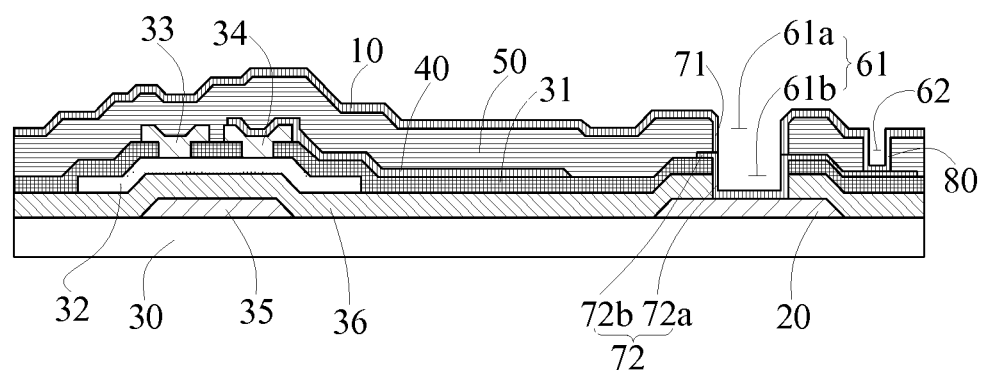
FIG. 3 is a diagram illustrating an array substrate of a second embodiment in the present invention.

As shown in FIGS. 2 and 3, as one aspect of the present invention, provided is an array substrate, which comprises a common electrode line 20, a thin film transistor 30 and a common electrode 10, wherein the common electrode line 20 is provided below an active layer 32 of the thin film transistor 30, and the common electrode line 20 is provided with a main via 6 thereabove 1. The common electrode 10 is connected to the common electrode line 20 through a main connection portion which is at least partially provided in the main via 61, and the main connection portion comprises an upper main connection portion 71 and a lower main connection portion 72. The lower main connection portion 72 comprises a main body 72a and a flange 72b provided on the main body 72a and extending in a direction away from a center of the main via 61, a lower end of the upper main connection portion 71 is connected to the flange 72b, and an upper end of the upper main connection portion 71 is connected to the common electrode 10.

Due to the addition of the flange 72b extending in the direction away from a center of the main via 61, vertical length of the upper main connection portion 71 is smaller than total depth of the main via 61, and vertical length of the main body 72a of the lower main connection portion 72 is smaller than total depth of the main via 61, therefore, when the main connection portion is formed, breach is unlikely to be formed on the upper main connection portion 71 and the lower main connection portion 72 of the main connection portion, and the metal layer forming the main connection portion is continuous and uniform, thus possibility of disconnection occurring in the main connection portion is decreased. In other words, in the array substrate provided by the present invention, reliable electrical connection between the common electrode line and the common electrode is realized.

It should be understood that, the above "the common electrode line 20 being provided apart from the active layer 32 of the thin film transistor 30" refers to the case that other layer(s) is(are) provided between a layer in which the common electrode line 20 is located and a layer in which the active layer 32 of the thin film transistor 30 is located (for example, in embodiments shown in FIGS. 2 and 3, an etch stop layer 31, a gate insulation layer 36 and a passivation layer 50 are provided between the layer in which the common electrode line 20 is located and the layer in which the active layer 32 of the thin film transistor 30 is located).

In the array substrates shown in FIG. 2 and FIG. 3, the thin film transistor 30 is of bottom-gate type, that is, a gate 35 of the thin film transistor 30 is provided below the active layer 32. A source 33 and a drain 34 of the thin film transistor 30 are provided in the same manner as that in the prior art, which will not repeated herein.

As one embodiment of the present invention, preferably, as shown in FIG. 2, the main via 61 comprises an upper main via 61a and a lower main via 61b, width of the upper main via 61a is larger than that of the lower main via 61b (the width herein refers to size of the upper main via 61a or the lower main via 61b in the horizontal direction in FIG. 2), that is, the main via 61 is formed as a stepped hole. The main body 72a of the lower main connection portion 72 is provided in the lower main via 61b, the flange 72b is provided at a position where the upper main via 61a and the lower main via 61b are connected (that is, on the step of the stepped hole), the upper main connection portion 71 is provided in the upper main via 61a, and the main connection portion is integrated with the common electrode 10.

The connection part between the upper main via 61a and the lower main via 61b may be a flat plane or inclined plane.

As another embodiment of the present invention, as shown in FIG. 3, the main via 61 comprises an upper main via 61a and a lower main via 61b, and the flange 72b extends from an upper end of the lower main via 61b to the exterior of the main via.

In the embodiment shown in FIG. 3, a lower end of the main connection portion 71 is completely attached to the upper surface of the flange 72b, therefore, in the embodiment, the connection between the common electrode 10 and the common electrode line 20 is more secure.

For ease of manufacture, the lower main connection portion 72 may be manufactured while the pixel electrode 40 is formed, and preferably, the upper main connection portion 71 is integrated with the common electrode 10, thus the upper main connection portion 71 may be formed while the common electrode 10 is formed. It should be understood that, the flange 72b shall not be connected to the pixel electrode 40.

In order to improve the security of the connection between the common electrode 10 and the common electrode line 20, preferably, the flange 72b is provided with a secondary via 62 thereabove, and the common electrode 10 is electrically connected to the flange 72b through a secondary connection portion 80 provided in the secondary via 62.

As one embodiment of the present invention, the active layer of the thin film transistor 30 is made of metal oxide, in this case, the array substrate further comprises an etch stop layer 31 provided above the active layer 32 of the thin film transistor 30, and the flange 72b is provided above the etch stop layer 31. When the active layer of the thin film transistor is made of metal oxide, advantages of the configuration of the etch stop layer is well known in the art, and will not repeated herein.

As stated above, as one embodiment of the present invention, a passivation layer is provided between the etch stop layer 31 and the common electrode 10.

Figure 4:
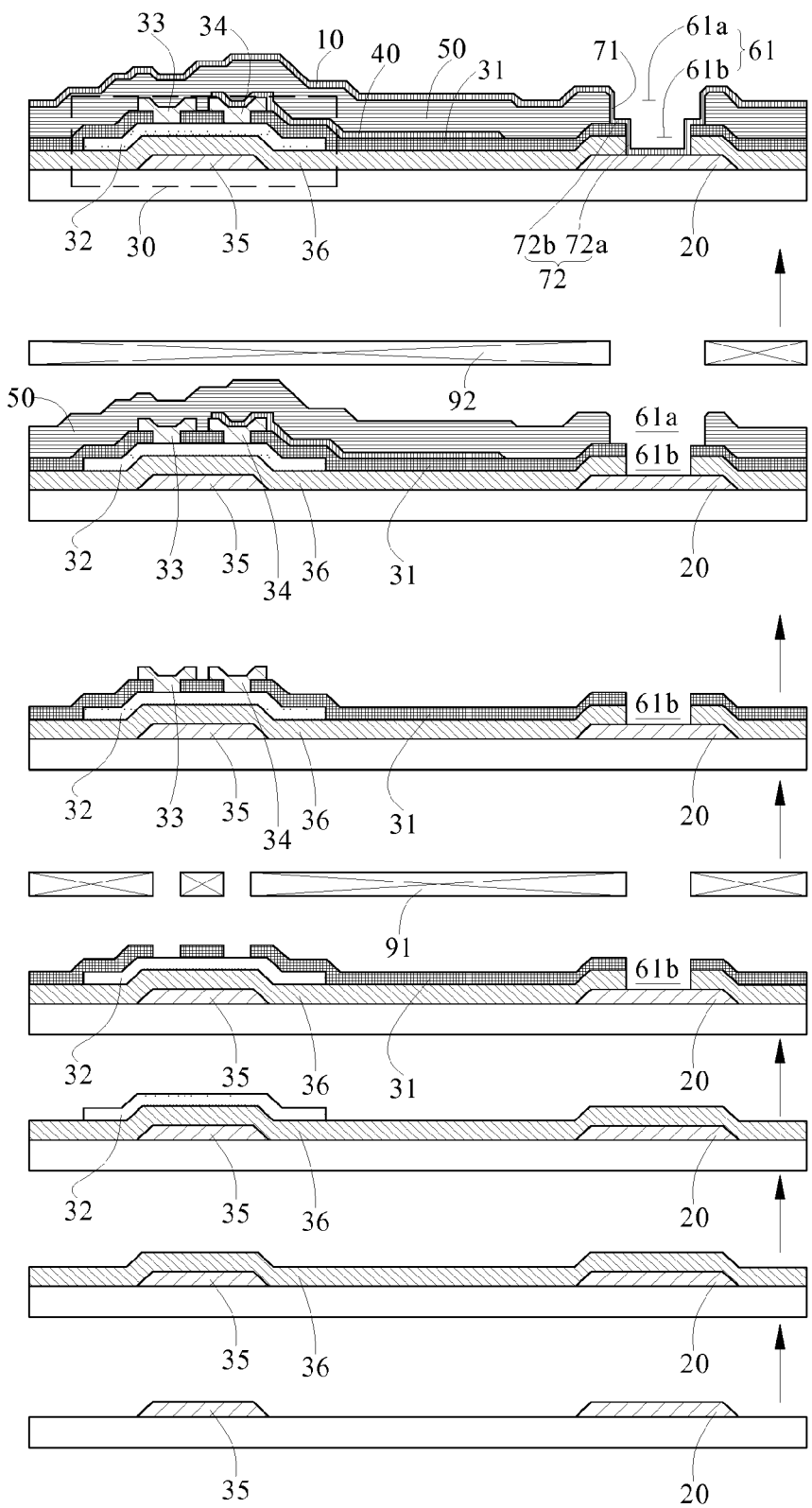
FIG. 4 is a flow chart of a manufacturing method of the array substrate shown in FIG. 2 in the present invention.

As another aspect of the present invention, provided is a manufacturing method of the above array substrate. FIG. 4 is a flow chart of a manufacturing method of the array substrate shown in FIG. 2, and as shown in the figure, the manufacturing method comprises steps of:

S10, forming a pattern including a common electrode line 20 and a gate 35 of a thin film transistor 30 on a base;

S11, forming a gate insulation layer 36 above the pattern including the common electrode line 20 and the gate 35 of the thin film transistor 30;

S12, forming an active layer 32 of the thin film transistor 30 on the gate insulation layer 36 above the gate 35;

S13, forming an etch stop layer 31 above the gate insulation layer 36 and the active layer 32 of the thin film transistor 30;

S14-1, forming a lower main via 61b and source/drain contact holes, so that the lower main via 61b is above the common electrode line 20, and the lower main via 61b exposes an upper surface of the common electrode line 20, wherein the lower main via 61b penetrates through the etch stop layer 31 and the gate insulation layer 36. The lower main via 61b penetrating through the etch stop layer 31 and the gate insulation layer 36 may be formed by a patterning process such as printing and transferring. In order to save cost, preferably, the lower main via 61b penetrating through the etch stop layer 31 and the gate insulation layer 36 may be formed by a traditional photolithographic process. Moreover, a source 33 and a drain 34 are formed in the source/drain contact holes;

S15, forming a passivation layer 50 above the etch stop layer 31;

S14-2, forming an upper main via 61a at a position corresponding to the lower main via 61b, and removing material for the passivation layer deposited in the lower main via 61b, so that the upper main via 61a penetrates through the passivation layer 50 to communicate with the lower main via 61b to form the main via 61;

S16, forming a pattern including a main connection portion at the main via 61, so that the main connection portion is at least partially provided in the main via, the main connection portion comprises an upper main connection portion 71 and a lower main connection portion 72, the lower main connection portion 72 comprises a main body 72a and a flange 72b provided on the main body and extending in a direction away from a center of the main via, and a lower end of the upper main connection portion 71 is connected to the flange 72b; and S17, forming a pattern of a common electrode 10, which is connected to an upper end of the upper main connection portion 71.

Furthermore, between the step S13 and the step S14-1, a step of forming a pixel electrode on the etch stop layer 31 is included.

It should be understood that, a sequence number is added before each step to facilitate description, but the sequence number before each step does not represent actual sequence of the step to be performed.

As shown in FIG. 4, after forming the etch stop layer 31 covering the base (step S13), in the step S14-1, the main via 61, the source 33 and the drain 34 may be formed by using a first mask plate 91 through the photolithographic process. After forming the passivation layer and the etch stop layer, in the step S14-2, the main via 61 may be formed by using a second mask plate 92 through the photolithographic process.

As shown in FIG. 4, the width of the upper main via 61a is larger than that of the lower main via 61b, and it should be understood that, the width herein refers to size of the upper main via 61a or the lower main via 61b in the horizontal direction in FIG. 4. In this embodiment, the steps S16 and S17 are performed simultaneously (that is, the common electrode 10 and the main connection portion are formed in the same step). As stated above, the upper main connection portion 71 formed in the step S16 is located in the main via 61, the main body 72a of the lower main connection portion 72 is located in the lower main via 61b, the flange 72b is located at a position where the upper main via 61a and the lower main via 61b are connected, and the flange 72b is provided on the etch stop layer 31.

Since the steps S16 and S17 are performed simultaneously, compared to the prior art described in the background, the method for manufacturing the array substrate of the present invention does not increase complexity in manufacturing the array substrate. It should be understood that, in FIG. 4, directions of arrows represent the sequence of steps in the manufacturing method of the invention.

Figure 5:
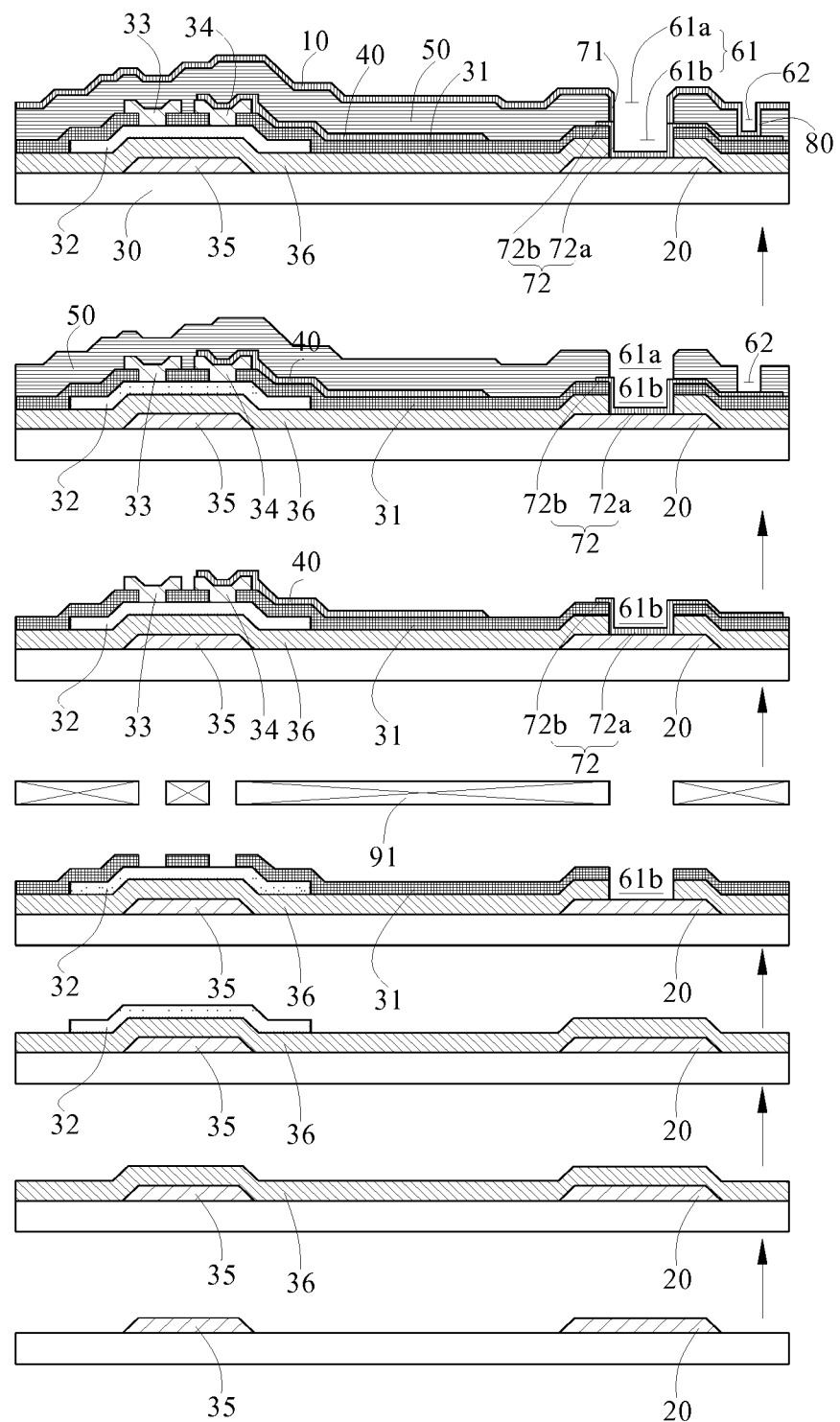
FIG. 5 is a flow chart of a manufacturing method of the array substrate shown in FIG. 3 by using in the present invention.

In the embodiment of the manufacturing method of the array substrate shown in FIG. 3, as shown in FIG. 5, the manufacturing method comprises steps of:

S10, forming a pattern including a common electrode line 20 and a gate 35 of a thin film transistor 30 on a base;

S11, forming a gate insulation layer 36 above the pattern including the common electrode line 20 and the gate 35 of the thin film transistor 30;

S12, forming an active layer 32 of the thin film transistor 30 on the gate insulation layer 36 above the gate 35;

S13, forming an etch stop layer 31 above the gate insulation layer 36 and the active layer 32 of the thin film transistor 30;

S14-1, forming a lower main via 61b and source/drain contact holes, so that the lower main via 61b is above the common electrode line 20, and the lower main via 61b exposes an upper surface of the common electrode line 20, wherein the lower main via 61b penetrates through the etch stop layer 31 and the gate insulation layer 36. The lower main via 61b penetrating through the etch stop layer 31 and the gate insulation layer 36 may be formed by a patterning process such as printing and transferring. In order to save cost, preferably, the lower main via 61b penetrating through the etch stop layer 31 and the gate insulation layer 36 may be formed by a traditional photolithographic process. Moreover, a source 33 and a drain 34 are formed in the source/drain contact holes;

S16-1, forming a lower main connection portion 72 at the lower main via 61b, in the embodiment, the lower main connection portion 72 is configured in the same manner as the lower main connection portion 72 shown in the embodiment illustrated in FIG. 4, and also comprises a main body 72a and a flange 72b, wherein the main body 72a is connected to the common electrode line, and the flange 72b of the lower main connection portion 72 is on the etch stop layer 31;

S15, forming a passivation layer 50 above the etch stop layer 31, so that the passivation layer 50 covers a part of the flange 72b, as shown in FIG. 5;

S14-2, forming an upper main via 61a at a position corresponding to the lower main via 61b so that the width of the upper main via 61a is equal to that of the lower main via 61b, and removing material for the passivation layer deposited in the lower main via 61b so that the upper main via 61a is communicated with the lower main via 61b to form the main via 61.

S16-2, forming an upper main connection portion 71 at the upper main via 61a to be connected with the flange 72b; and S17, forming a pattern of a common electrode 10 on the passivation layer 50, so that the common electrode 10 is connected to an upper end of the upper main connection portion 71.

A pixel electrode is further formed in the step S16-1, and the step S16-2 and the step S17 may be performed simultaneously.

As shown in FIG. 5, the lower main connection portion 72 is formed while the pixel electrode 40 is formed, and the upper main connection portion 71 is formed while the common electrode 10 is formed, therefore, compared to the prior art described in the background, the method for manufacturing the array substrate of the present invention does not increase complexity in manufacturing the array substrate. It should be understood that, in the FIG. 5, directions of arrows represent the sequence of steps in the manufacturing method of the invention.

Preferably, in the embodiment, the manufacturing method further comprises a step of forming a secondary via in the substrate. Specifically, in the embodiment in which the array substrate comprises the secondary via, the manufacturing method further comprises steps of:

S18, forming a secondary via 62 above the flange 72b; and

S19, providing, in the secondary via 62, a secondary connection portion 80 for electrically connecting the common electrode 10 with the flange 72b.

In order to reduce steps for manufacturing the array substrate so as to increase the productivity, preferably, the steps S19 and S17 are performed simultaneously. That is, the secondary connection portion 80 and the common electrode 10 are formed in the same step.

It should be understood by a person skilled in the art that, although, in step S14-2 in the embodiment, the upper main via 61a is formed to have a width being equal to that of the lower main via 61b, which is just an example, alternatively, the upper main via 61a may be formed to have a width larger than that of the lower main via 61b, which is not illustrated in the drawings.

In summary, during manufacturing the array substrate of the present invention by using the manufacturing method of the present invention, complexity of the manufacturing method is not increased. That is, when manufacturing the array substrate of the present invention by using the manufacturing method of the present invention, a high productivity may be obtained.

As still another aspect of the present invention, provided is a display device comprising an array substrate, which is the above array substrate of the present invention.

It should be understood that, the display device further comprises a color filter substrate to be assembled with the array substrate.

The display device in the present invention may be an electronic device, such as a liquid crystal panel, a TV, a mobile phone, a tablet computer or the like.

In the array substrate provided by the present invention, due to addition of the flange extending in the direction away from the center of the main via, vertical length of the upper main connection portion is smaller than total depth of the main via, and vertical length of the main body of the lower main connection portion is smaller than total depth of the main via, therefore, when the main connection portion is formed, breach or uncontinual phenomenon is unlikely to be formed, thus possibility of disconnection occurred in the main connection portion is decreased. In other words, in the array substrate provided by the present invention, reliable electrical connection between the common electrode line and the common electrode is realized. Hence, a display device comprising the array substrate may display images better.

It should be understood that, the above embodiments are only exemplary embodiments used to explain the principle of the present invention and the protection scope of the present invention is not limited thereto. The person skilled in the art can make various variations and modifications without departing from the spirit and scope of the present invention, and these variations and modifications should be considered to belong to the protection scope of the invention.

The invention claimed is:

1. A manufacturing method of an array substrate comprising steps of:
    S10, forming a pattern including a common electrode line and a gate of a thin film transistor on a base;
    S11, forming a gate insulation layer above the pattern including the common electrode line and the gate of the thin film transistor;
    S12, forming an active layer of the thin film transistor on the gate insulation layer above the gate;
    S13, forming an etch stop layer above the gate insulation layer and the active layer of the thin film transistor;
    S15, forming a passivation layer above the etch stop layer, wherein the manufacturing method further comprises steps of:
    S14, forming a main via, so that the main via is above the common electrode line and reaches the common electrode line;
    S16, forming a pattern including a main connection portion, so that the main connection portion is at least partially provided in the main via, the main connection portion comprises an upper main connection portion and a lower main connection portion, the lower main connection portion comprises a main body and a flange provided on the main body and extending towards a direction away from a center of the main via, a lower end of the upper main connection portion is connected to the flange, and the main body is connected to the common electrode line; and
    S17, forming a pattern of a common electrode, so that the common electrode is connected to an upper end of the upper main connection portion.

2. The manufacturing method of claim 1, wherein the active layer of the thin film transistor is made of metal oxide, and wherein
    the step S14 comprises steps of:
    S14-1, after the step S13, forming a lower main via penetrating through the etch stop layer and the gate insulation layer to reach the common electrode line; and
    S14-2, after the step S15, forming an upper main via at a position on the etch stop layer corresponding to the lower main via, and removing material for the passivation layer deposited in the lower main via, so that the upper main via is communicated with the lower main via to form a main via.

3. The manufacturing method of claim 2, wherein a width of the upper main via is larger than that of the lower main via, the steps S16 and S17 are performed simultaneously, the upper main connection portion formed in the step S16 is located in the upper main via, the main body of the lower main connection portion is located in the lower main via, the flange is located at a position where the upper main via and the lower main via are connected, and the flange is provided on the etch stop layer.

4. The manufacturing method of claim 2, wherein the width of the upper main via is larger than or equal to that of the lower main via, and the step S16 comprises steps of:
    S16-1, forming the lower main connection portion, so that the flange is on the etch stop layer;
    S16-2, forming the upper main connection portion, wherein
    the step S16-1 is performed between the step S14-1 and the step S15, and in the step S16-1, a pixel electrode is formed above the etch stop layer, and the steps S16-2 and S17 are performed simultaneously.

5. The manufacturing method of claim 4, further comprises steps of:
    S18, forming a secondary via above the flange; and
    S19, providing, in the secondary via, a secondary connection portion for electrically connecting the common electrode with the flange.

6. The manufacturing method of claim 5, wherein the steps S19 and S17 are performed simultaneously.

* * * * *